(12) United States Patent
Paik et al.

(10) Patent No.: US 6,514,560 B2
(45) Date of Patent: Feb. 4, 2003

(54) METHOD FOR MANUFACTURING CONDUCTIVE ADHESIVE FOR HIGH FREQUENCY FLIP CHIP PACKAGE APPLICATIONS

(75) Inventors: Kyung wook Paik, Taejon (KR); Myung jin Yim, Taejon (KR); Woon seong Kwon, Taejon (KR)

(73) Assignee: Korea Advanced Institute of Science and Technology, Taejon (KR)

( * ) Notice: Subject to any disclaimer, the term of this patent is extended or adjusted under 35 U.S.C. 154(b) by 0 days.

(21) Appl. No.: 10/068,878

(22) Filed: Feb. 11, 2002

(65) Prior Publication Data

US 2002/0111423 A1 Aug. 15, 2002

(30) Foreign Application Priority Data

Feb. 12, 2001 (KR) ................................. 01-6745

(51) Int. Cl.$^7$ .................................................. B05D 5/10
(52) U.S. Cl. ...................... 427/96; 427/201; 427/207.1; 427/215; 427/222
(58) Field of Search ....................... 427/96, 201, 207.1, 427/215, 222

(56) References Cited

U.S. PATENT DOCUMENTS

| | | | |
|---|---|---|---|
| 4,859,268 A | * 8/1989 | Joseph et al. ............ | 156/275.5 |
| 5,043,102 A | 8/1991 | Chen et al. | |
| 5,886,415 A | * 3/1999 | Akagawa .................... | 257/789 |
| 5,891,367 A | 4/1999 | Basheer et al. | |
| 6,238,597 B1 | * 5/2001 | Yim et al. .................. | 252/512 |

FOREIGN PATENT DOCUMENTS

| | | | |
|---|---|---|---|
| JP | 09-310057 | * | 12/1997 |
| JP | 09-310058 | * | 12/1997 |
| JP | 2000-207942 | * | 7/2000 |
| JP | 2001-324249 | * | 11/2001 |
| JP | 2002-167569 | * | 6/2002 |
| WO | WO 95/16998 | * | 6/1995 |
| WO | WO 02/15259 | * | 2/2002 |

OTHER PUBLICATIONS

Miessner et al, Int. Conference on Adhesive Joining and Coating Technology in Electronics Manufacturing, Adhesives '98, 3rd, 1998, pp 299–304.*
Daoqiang et al, IEEE Transactions on Electronics Packaging Manufacturing, 22(4), pp 324–330, 1999.*

* cited by examiner

Primary Examiner—Erma Cameron
(74) Attorney, Agent, or Firm—Oliff & Berridge, PLC

(57) ABSTRACT

Disclosed is a method for manufacturing a low dielectric constant conductive adhesive that is appropriate for a radio frequency packaging application. This method is characterized by mixing a thermosetting resin with surface-treated conductive particles and non-conductive particles for prevention of agglutination and thereby forming the conductive adhesive. The manufactured conductive adhesive is useful for a bonding material of the radio frequency packaging. According to the present invention, it is possible to obtain a flip chip bonding having superior mechanical and electrical performance compared with the conventional flip chip bonding art. Also, since the adhesive has a low high frequency loss and a low dielectric constant, it is possible to realize a flip chip package having a superior electrical performance. The conductive adhesive is particularly useful for the flip chip packaging of a device having a bandwidth of microwave and millimeter wave.

10 Claims, 2 Drawing Sheets

METHOD FOR MANUFACTURING CONDUCTIVE ADHESIVE FOR HIGH FREQUENCY FLIP CHIP PACKAGE APPLICATIONS

BACKGROUND OF THE INVENTION

1. Field of the Invention

The present invention relates to a method of manufacturing a conductive adhesive that is appropriate for a flip chip bonding, and more particularly, to a method of manufacturing a conductive adhesive that is appropriate for a high frequency package, and having a low dielectric constant.

2. Description of the Related Art

Electronic packaging is a wide and various system-manufacturing technology including all processing steps from the semiconductor device to the final product. The semiconductor technology that is abruptly developing in these days enables to integrate cells of one million or more. Particularly, non-memory device technology is being advanced toward many number of I/O pins, larger die size, larger heat radiation, high electrical performance, and so on. However, the electronic packaging technology for packaging these devices does not keep pace with the abrupt advancement of the semiconductor industries.

The electronic packaging is a very important technology of deciding performance, size, price, reliability and so on of the final electronic product, and has a tendency in that its stature becomes more important in recent electronic products pursuing high electrical performance, micro miniaturization/high density, low power consumption, multifunction, high speed signal processing, permanent reliability, etc. Especially, micro packaging element is an essential one used in computer, information telecommunications, wireless mobile telecommunications, high price home electronics, or the like. Among the micro packaging technologies, the utilization range of the flip chip bonding technology that is one of the technologies for electrically connecting the chip on the substrate is currently widened in display packaging appliances, such as smart card, liquid crystal display (LCD), plasma display panel, etc., computer, handheld terminal, telecommunications system, etc.

However, since these flip chip bonding technologies are subject to a complicated bonding process including coating of solder flux on to the substrate, alignment of solder bump-formed chip and surface electrode-formed substrate, reflow of solder bump, removal of remaining flux, and filling and hardening of underfill, they are drawbacks in that the process becomes complicated, and the manufactured product is a very expensive.

Thus, in order to decrease the number of the aforementioned steps, there increases an interest on wafer-based packaging technology in which a polymer material having functions of flux and underfill in the wafer state is coated and process.Also, there are many researches on the flip chip bonding technologies using conductive adhesive and having advantages of low price compared with a general solder flip chip, realization of micropitch electrode, friendly environment excluding the use of flux or lead component, carrying out of low temperature process and so on.

The conductive adhesive is largely classified into anisotropic conductive adhesive ('ACA') and isotropic conductive adhesive each of which basically contains conductive particles, such as nickel (Ni), Au/polymer, silver (Ag) or the like, and a blend type Insulating resin in which thermosetting and thermoplastic properties are mixed. Further, there is being introduced a flip chip technology using non-conductive adhesive ('NCA') not containing conductive particles.

Researches on the flip chip technologies using environment-friendly anisotropic conductive film or paste as a bonding material have been actively carried out. With these researches, there are being diffused development researches of conductive adhesive material and application researches on the flip chip technologies using the conductive adhesive. Also, there are actively carried out researches on utilization possibility of the conductive adhesive and development of bonding mechanism of the conductive adhesive.

Further, as there recently increase interests on high speed/high density radio frequency packaging using the flip chip technology, there accordingly increase interests on use of the conductive adhesive as the flip chip bonding material of the RF device instead of use of solder. However, such conventional trials have a limitation in wide and various use because they have electromagnetic coupling problem in the RF region of the conventional conductive adhesive flip chip technology and occurrence problem of resonance phenomenon.

SUMMARY OF THE INVENTION

Accordingly, the present invention has been devised to solve the foregoing problems of the prior art, and it is an object of the invention to provide a method for manufacturing a conductive adhesive having a low dielectric constant by adding non-conductive particles to the conventional anisotropic conductive adhesive.

It is another object of the invention to provide a method for manufacturing a conductive adhesive capable of improving the radio frequency characteristic by after the flip chip connection of the RF device, decreasing electromagnetic coupling phenomenon occurring between conductive components, and thus decreasing parasitic components in the connection portion of the flip chip assembly.

It is further another object of the invention to provide a method for manufacturing a conductive adhesive capable of decreasing product defects due to agglutination between conductive particles and non-conductive particles distributed in a thermosetting resin.

To accomplish the above object and other advantages, there is a method of manufacturing a conductive adhesive for a high frequency flip chip package application. The method comprises: a first step of preparing a resin compound by mixing 15–25% by weight solid bisphenol A type epoxy resin, 40–50% by weight liquid bisphenol F type epoxy resin, and 30–40% by weight phenoxy resin; a second step of agitating and mixing the resin compound with an organic solvent in which methyl-ethyl ketone and toluene are mixed in a volume ratio of 1:3, to form a thermosetting resin; a third step of mixing the thermosetting resin with conductive particles and non-conductive particles that have been surface-treated in methyl-ethyl ketone or γ-glycidoxypropyl-trimethoxysilane; and a fourth step of mixing a resulting composition of the third seep with an imidazole-based hardener in which the imidazole based hardener is mixed with the resulting composition of the third step by 15–30 g per 100 g of epoxy resin contained in the resulting composition for prevention of agglutination. It is noted that since a resin such as acrylate or the like can be used as the polymer resin instead of the aforementioned epoxy, the claims of the present invention is not limited to the epoxy resin alone.

Preferably, the second step is carried out at a temperature range of 85–95° C. for 24–36 hours.

Preferably, the conductive particle is comprised of nickel-, copper-, or gold-coated polymer balls.

Preferably, the conductive particles have a size ranged from 4–10 μm.

The conductive particle is comprised of one selected from the group consisting of $SiO_2$, Teflon, and nano-void. Preferably, the conductive particles have a size of less than 1 μm in diameter.

According to another aspect of the invention, the method may further comprise a step of adding γ-glycidoxypropyl-trimethodxysilane to the resulting composition of the third step to prevent agglutination of the particles between the third step and the fourth step.

Selectively, the method, after the fourth step, further comprises a fifth step of placing the resulting composition of the fourth step in a vacuum state to remove impurities including voids.

According to further another aspect of the invention, the method further comprises a step of forming a film having a constant thickness on a releasing paper film by applying a doctor blade method, or a comma roll method to the resulting composition of the fifth step after the fifth step.

Preferably, the film shaped adhesive has a thickness ranged from 10 μm to 50 μm.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENT

There will be now described preferred embodiments with reference to the accompanying drawings.

Figure 1:
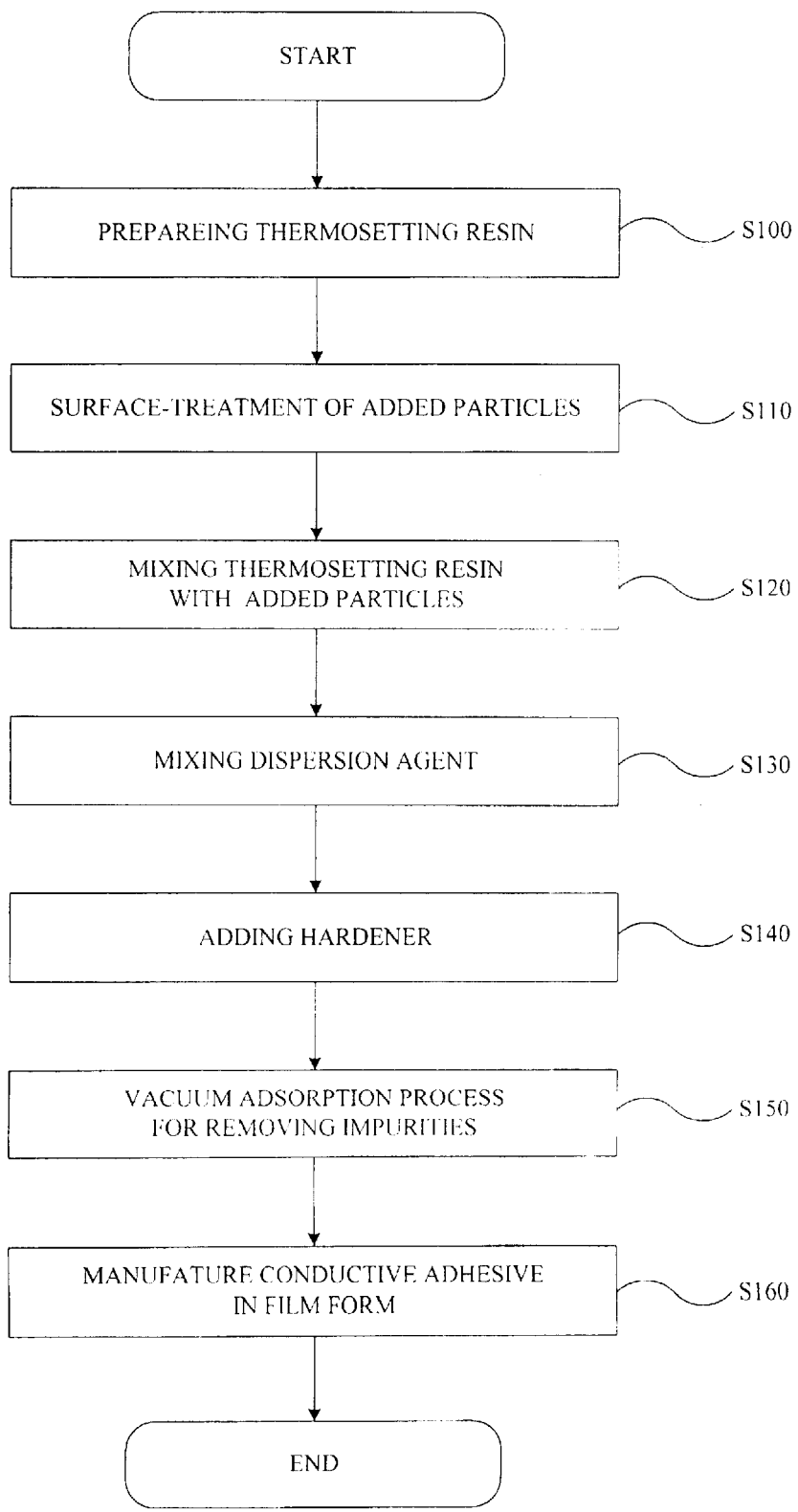
FIG. 1 is a process flow diagram for describing a method for manufacturing a conductive adhesive for a flip chip bonding in accordance with one preferred embodiment of the present invention.

FIG. 1 is a process flow diagram for describing a method for manufacturing a conductive adhesive for a flip chip bonding in accordance with one preferred embodiment of the present invention.

Referring to FIG. 1, a thermosetting resin is first formed at a step of 100 (S100). The thermosetting resin is formed by mixing 15–25 w % bisphenol A type epoxy resin in a solid state, 40–50 w % bisphenol F type epoxy resin in a liquid state, and 30–40 w % phenoxy resin to form a resin compound, and agitating and mixing the resin compound with an organic solvent in which methyl-ethyl ketone and toluene are mixed in a volume ratio of 1:3.

After that, in order to prevent an agglutination of conductive particles and non-conductive particles functioning as additives, the conductive particles and non-conductive particles have been surface-treated at a step of 110 (S110). While the present embodiment describes that the surface-treatment step (S110) of the added particles is carried out after the forming step (S100) of the thermosetting resin, the added particles can be prepared in a state that the surface treatment has been completed. So, it is noted that the claims of the present invention should not be limited by the sequence of the steps S100 and S110.

In the present embodiment, nickel (Ni) particles having 5 μm in diameter as the conductive particle and $SiO_2$ particles having 1 μm in diameter as the non-conductive particle are respectively used. The conductive particles and non-conductive particles should be uniformly distributed in the thermosetting resin. Then, due to the agglutination of the particles, a defect occurs in the finally manufactured conductive adhesive product, so that electrical and mechanical phenomenon may occur. In order to prevent this agglutination phenomenon, the conductive particles and non-conductive particles are dipped in a dispersion agent solution containing γ-glycidoxypropyl-trimethoxysilane as a main component for the surface treatment.

Afterwards, the thermosetting resin and the surface-treated particles are mixed with each other, to thereby form a mixture at a step of 120 (S120). Thereafter, in order to prevent the agglutination of the particles, the dispersion agent solution is again added to the mixture and they are mixed at a step of 130 (S130).

Next, a resulting mixture of the step of 130 is mixed with an imidazole-based hardener in which the imidazole-based hardener is mixed by 15–30 g per 100 g of the thermosetting resin mixture at a step of 140 (S140).

In order to remove impurities such as voids and so on from the resulting composition of the step of 140, the resulting composition is placed in a vacuum state for 12 hours at a step of 140 (S150). In case where the conductive adhesive of the present invention is manufactured in a paste form, the method carries out a post-process such as a drying step, etc., after the completion of the step of 150.

Then, in case where the conductive adhesive of the present invention is manufactured in a film form, the method further carries out a step of making an adhesive film having a constant thickness on a releasing paper film by applying a doctor blade method. At this time, the film shaped adhesive has a thickness ranged from 10 μm to 50 μm (S160). After that, in order to remove the organic solvent, the adhesive film is placed at a temperature of 80° C. for one minute.

Figure 2:
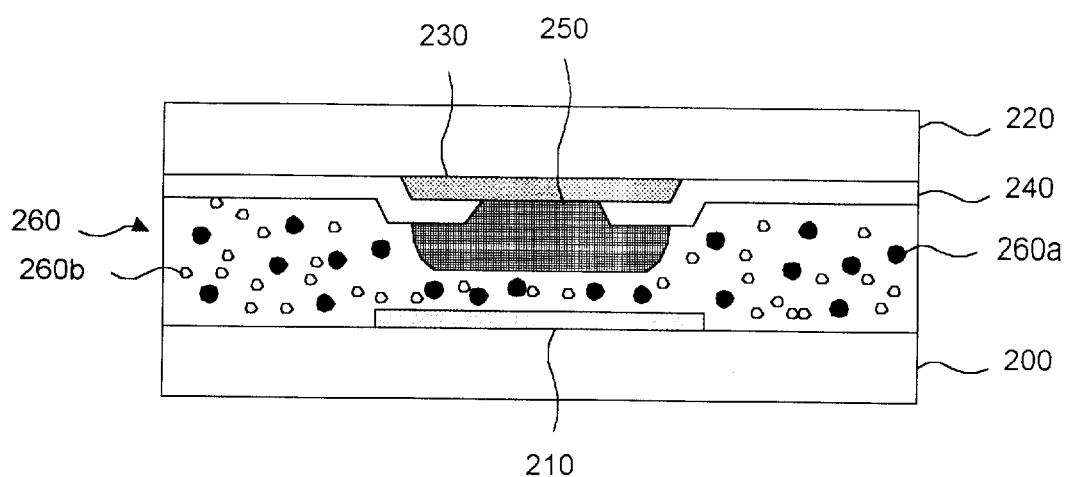
FIG. 2 is a sectional view of an RF chip, which is bonded, in a flip chip bonding method using the conductive adhesive in accordance with one preferred embodiment of the invention.

FIG. 2 is a sectional view of an RF chip that is bonded in a flip chip bonding method using a conductive adhesive in accordance with one preferred embodiment of the invention. Like the description of FIG. 1, the structure of FIG. 2 is made by coating the conductive adhesive provided in the preferred embodiment of the present invention on a substrate, aligning the RF chip on which non-solder bumps are formed, and applying heat and pressure to form a flip chip connection. The coating process of the conductive adhesive on the substrate is performed by pressing the substrate toward the conductive adhesive-formed face at a temperature of 80° C. and a pressure of 5 kgf/cm$^2$ and then removing the releasing paper film. If the conductive adhesive of the present invention has a paste form, the conductive adhesive is coated on the substrate in a desired form by using an injection device or screen printer. The conductive adhesive is relatively transparent, which enables to align electrodes of the substrate with the bumps of the RF chip. When the thermal press is carried out at a temperature of 150° C., the conductive adhesive has a hardening property in which the hardening can occur within 5 minutes that is a relative fast time limit. In FIG. 2, a reference numeral 200 represent a substrate, a reference numeral 210 a metal pad, a reference numeral 220 an RF chip, a reference numeral 230 an aluminum pad, a reference numeral 240 a passivation film of SiO$_2$, a reference numeral 250 a non-electrolytic nickel bump, a reference numeral 260 a conductive adhesive, a reference numeral 260*a* a conductive particle, and a reference numeral 260*b* a non-conductive particle, respectively.

As described previously, it is possible to obtain a flip chip bonding having superior mechanical and electrical performance compared with the conventional flip chip bonding art. Also, since the adhesive has a low high frequency loss and a low dielectric constant, it is possible to realize a flip chip package having a superior electrical performance. The conductive adhesive is particularly useful for the flip chip packaging of a device having a bandwidth of microwave and millimeter wave.

Although the preferred embodiments of the present invention have been disclosed for illustrative purposes, those skilled in the art will appreciate that various modifications, additions and substitutions can be made without departing from the scope and spirit of the invention as defined in the accompanying claims.

What is claimed is:

1. A method of manufacturing a conductive adhesive for a high frequency flip chip package application, the method comprising:

a first step of preparing a resin compound by mixing 15–25% by weight bisphenol A epoxy resin in a solid state, 40–50% by weight bisphenol F epoxy resin in a liquid state, and 30–40% by weight phenoxy resin;

a second step of agitating and mixing the resin compound with an organic solvent in which methyl-ethyl ketone and toluene are mixed in a volume ratio of 1:3, to form a thermosetting resin;

a third step of mixing the thermosetting resin with conductive particles and non-conductive particles that have been surface treated in methyl-ethyl ketone or γ-glycidoxypropyl-trimethoxysilane; and a fourth step of mixing a resulting composition of the third step with an imidazole-based hardener in an amount of 15–30 g of imidazole-based harder per 100 g of epoxy resin contained in the resulting composition for prevention of agglutination.

2. The method of claim 1, wherein the second step is carried out at a temperature range of 85–95° C. for 24–36 hours.

3. The method of claim 1, wherein the conductive particle is comprised of nickel, copper, or gold-coated polymer ball.

4. The method of claim 3, wherein the conductive particles have a size ranged from 4–10 μm.

5. The method of claim 1, wherein the non-conductive particle is comprised of one selected from the group consisting of SiO$_2$, PTFE, and nano-void.

6. The method of claim 5, wherein the non-conductive particles has a size of less than 1 μm in diameter.

7. The method of claim 1, between the third step and the fourth step, further comprising a step of adding γ-glycidoxypropyl-trimethodxysilane to the resulting composition of the third step to prevent agglutination of the particles.

8. The method of claim 1, after the fourth step, further comprising a fifth step of placing the resulting composition of the fourth step in a vacuum state to remove impurities including voids.

9. The method of claim 8, after the fifth step, further comprising a step of forming a film having a constant thickness on a releasing paper film by applying a doctor blade method, or a comma roll method to the resulting composition of the fifth step.

10. The method of claim 9, wherein the film shaped adhesive has a thickness ranged from 10 μm to 50 μm.

* * * * *